(12) United States Patent
Wang et al.

(10) Patent No.: US 12,514,479 B2
(45) Date of Patent: Jan. 6, 2026

(54) DYNAMIC INCREMENTAL-SAR ANALOG-TO-DIGITAL CONVERSION

(71) Applicant: The Regents of the University of California, Oakland, CA (US)

(72) Inventors: Jun Wang, San Diego, CA (US); Gert Cauwenberghs, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 481 days.

(21) Appl. No.: 18/001,686

(22) PCT Filed: Jun. 15, 2021

(86) PCT No.: PCT/US2021/037478
§ 371 (c)(1),
(2) Date: Dec. 13, 2022

(87) PCT Pub. No.: WO2021/257601
PCT Pub. Date: Dec. 23, 2021

(65) Prior Publication Data
US 2023/0248292 A1     Aug. 10, 2023

Related U.S. Application Data

(60) Provisional application No. 63/039,452, filed on Jun. 15, 2020.

(51) Int. Cl.
*A61B 5/302*    (2021.01)

(52) U.S. Cl.
CPC .................................... *A61B 5/302* (2021.01)

(58) Field of Classification Search
CPC ........... A61B 5/276; A61B 5/30; A61B 5/302; A61B 5/369
See application file for complete search history.

(56) References Cited

U.S. PATENT DOCUMENTS

2004/0001018 A1*   1/2004   Hales .................... H03M 1/004
                                                  341/155
2007/0208262 A1*   9/2007   Kovacs .................. A61B 5/332
                                                  600/509

(Continued)

FOREIGN PATENT DOCUMENTS

CN         105007079 B  *  4/2018
WO    WO-2019162518 A1     8/2019
WO    WO-2021061218 A1  *  4/2021   .......... H03M 1/0612

OTHER PUBLICATIONS

Aziz, J. et al., "256-channel neural recording microsystem with on-chip 3D electrodes." In 2007 IEEE International Solid-State Circuits Conference. Digest of Technical Papers (pp. 160-161; 594), Feb. 2007.

(Continued)

*Primary Examiner* — Eun Hwa Kim
(74) *Attorney, Agent, or Firm* — FisherBroyles, LLP

(57) ABSTRACT

A system and a method for recording neural signals. A neural interface system-on-chip for recoding the signals includes one or more electrodes integrated on a complimentary metal-oxide-semiconductor integrated circuit and coupled to one or more corresponding analog front end components. The analog front end components are configured to be programmable for recording one or more neural signals and to operate in at least one of the following selectable programmable modes: a voltage clamp mode and a current clamp mode. The neural interface system-on-chip also includes one or more analog to digital converter components that are coupled to the electrodes.

17 Claims, 14 Drawing Sheets

(56) References Cited

U.S. PATENT DOCUMENTS

| | | |
|---|---|---|
| 2012/0194372 A1 | 8/2012 | Venkatraman et al. |
| 2017/0258329 A1 | 9/2017 | Marsh |
| 2018/0103858 A1 | 4/2018 | Marcus et al. |
| 2018/0206788 A1 | 7/2018 | Andersen |
| 2019/0126047 A1 | 5/2019 | Kassiri Bidhendi et al. |
| 2019/0282817 A1 | 9/2019 | Muller et al. |

OTHER PUBLICATIONS

De Dorigo, D. et al. "Fully Immersible Subcortical Neural Probes with Modular Architecture and a Delta-Sigma ADC Integrated Under Each Electrode for Parallel Readout of 144 Recording Sites." IEEE Journal of Solid-State Circuits 53.11 (2018): 3111-3125.

Joshi, S. et al., "2pJ/MAC 14b 8x8 Linear Transform Mixed-Signal Spatial Filter in 65nm CMOS with 84db Interference Suppression." In 2017 IEEE International Solid-State Circuits Conference (ISSCC) (pp. 364-365), Feb. 2017.

Khurana, H.S. et al., "Recode Then LSB-first SAR ADC for Reducing Energy and Bit-cycles." IEEE International Symposium on Circuits and Systems (ISCAS'2018), 2018.

Kim, C. et al., "A 92dB Dynamic Range Sub-?V RMS-Noise 0.8 ?W/ch Neural-Recording ADC Array with Predictive Digital Autoranging." In 2018 IEEE International Solid-State Circuits Conference—(ISSCC) (pp. 470-472), Feb. 2018.

Kim, C. et al., "Sub-?Vrms-Noise Sub-?W/Channel ADC-Direct Neural Recording With 200-mV/ms Transient Recovery Through Predictive Digital Autoranging." IEEE Journal of Solid-State Circuits, vol. 53 (11), pp. 3101-3110, 2018.

Lopez, C.M. et al., "A 16384-Electrode 1024-Channel Multimodal CMOS MEA for High-Throughput Intracellular Action Potential Measurements and Impedance Spectroscopy in Drug-Screening Applications." In 2018 IEEE International Solid-State Circuits Conference—Feb. 2018.

Manickam, A. et al., "A CMOS Biosensor Array with 1024 3-Electrode Voltammetry Pixels and 93dB Dynamic Range." In 2019 IEEE International Solid-State Circuits Conference—(ISSCC) (pp. 192-194). IEEE. (ISSCC) (pp. 464-466), Feb. 2019.

Musk E. et al. "An Integrated Brain-Machine Interface Platform with Thousands of Channels." J Med Internet Res 2019;21(10):e16194.

Yaul, F.M. et al., "A 10b 0.6 nW SAR ADC with Data-Dependent Energy Savings Using LSB-First Successive Approximation." In 2014 IEEE International Solid-State Circuits Conference Digest of Technical Papers (ISSCC) (pp. 198-199), Feb. 2014.

Yaul, F.M. et al., "A 10 bit SAR ADC With Data-Dependent Energy Reduction Using LSB-First Successive Approximation." IEEE Journal of Solid-State Circuits, vol. 49 (12), pp. 2825-2834, Dec. 2014.

Zhang, Z. et al., "A Dynamic Tracking Algorithm Based SAP ADV in Bio-Related Applications," IEEE Access 6 (2018): 62166-62173.

Abbott, J. et al., "The Design of a CMOS Nanoelectrode Array with 4096 Current-Clamp/Voltage-Clamp Amplifiers for Intracellular Recording/Stimulation of Mammalian Neurons," IEEE Journal of Solid-State Circuits, Sep. 2020, 55(9): 2567-2582.

Sutor, B. et al. "Voltage-clamp-controlled current-clamp recordings from neurons: an electrophysiological technique enabling the detection of fast potential changes ar reset holding potentials," Pflugers Archive, Eur J Physiology, (2003) 446:133-141.

Wang et al., "1024-Electrode Hybrid Voltage/Current-Clamp Neural Interface system-on-Chip with Dynamic Incremental-SAR Acquisition," 2020 IEEE Symposium on VLSI Circuits, Aug. 10, 2020.

\* cited by examiner

DYNAMIC INCREMENTAL-SAR ANALOG-TO-DIGITAL CONVERSION

This application is a national stage entry of Patent Cooperation Treaty No. PCT/US2021/037478 filed Jun. 15, 2021, entitled "DYNAMIC INCREMENTAL-SAR ANALOG-TO-DIGITAL CONVERSION," which claims priority to U.S. Provisional Patent Appl. No. 63/039,452 filed Jun. 15, 2020, entitled "DYNAMIC INCREMENTAL-SAR ANALOG-TO-DIGITAL CONVERSION," the disclosures of which are incorporated herein by reference in their entirety.

STATEMENT OF GOVERNMENT SPONSORED SUPPORT

This invention was made with government support under CMMI1728497 awarded by the National Science Foundation. The government has certain rights in the invention.

TECHNICAL FIELD

The subject matter disclosed herein relates to a method and apparatus for efficient analog-to-digital conversion.

BACKGROUND

Many types of signals from sensors or sensor arrays have wide dynamic range, but most of the time change relatively little between consecutive samples. Examples of such signals are various physiological indicators of health and wellness in wearable or implantable biosensors, such as blood pressure, photoplesmography (PPG), electrocardiography (ECG), and electrochemical concentrations in cardiovascular and metabolic health sensing, and the electroencephalogram (EEG), electrocorticogram (ECoG) and spike neural recordings in brain activity monitoring.

SUMMARY

In some implementations, the current subject matter relates to a system and a method for energy-efficient digitization of one or multiple analog signals, in a number of successive approximation steps that are less than the number of bits in the analog-to-digital conversion (ADC). For each new sample, a conversion starts from the conversion result of the previous sample, and makes dynamic incremental adjustments on a variable radix-2 base in the successive approximation register (SAR) to expand or contract the search region depending on whether the signal value is detected within the region. The number of steps required to reach full precision increases with the magnitude of the signal change between consecutive samples, and with the rate of errors in the analog comparison, but in practice is low on average. Dynamic incremental-SAR ADC is capable of digitizing electrophysiological signals such as the electrocardiogram, electroencephalogram, or electrocorticogram in less than three steps per conversion per Nyquist-rate sample at essentially no loss in precision, reducing the signal acquisition energy at least two-fold.

In some implementations, the current subject matter relates to a system for recording neural signals (e.g., of a user's brain, etc.). The system may include one or more electrodes coupled to one or more corresponding analog front end components. The system may also include one or more analog to digital converter components coupled to the one or more electrodes. The electrodes, the analog front end components and the analog to digital converter components may be configured to form a neural interface system-on-chip for recording one or more neural signals.

In some implementations, the current subject matter may include one or more of the following optional features. The electrodes may be integrated on a complimentary metal-oxide-semiconductor integrated circuit. The analog front end components may be configured to be programmable for recording the one or more neural signals. For example, the electrodes may be vertically coupled to the corresponding analog front end components.

In some implementations, the analog front end components may be configured to operate in at least one of the following programmable modes: a voltage clamp mode and a current clamp mode. In the voltage clamp mode, the analog front end components may be configured to record one or more currents passing from the corresponding electrodes. As a non-limiting example, the currents may be associated with one or more ion currents configured to pass through one or more neural cells. In the current clamp mode, the analog front end components may be configured to record voltage signals. As a non-limiting example, the voltage signals may be generated by one or more neural cells after application of current to the neural cells.

In some implementations, the analog to digital converter components may be configured to perform digital conversion of one or more analog signals received from the analog front end components. Each analog to digital converter component may be configured to support a plurality of analog front end components.

In some implementations, the analog to digital converter components may include a sampling component, a counter component and index component. The analog to digital converter components may be configured to operate using at least one of the following modes: a successive approximation register mode and an incremental successive approximation register mode. In the successive approximation register mode, the index component of the analog to digital converter components may be configured to determine a least significant bit index value. The least significant bit index value may be determined based on a sampling of one or more input signals to the analog to digital converter components by the sampling component. The sampling may be performed using a plurality of sampling cycles. During each cycle in the plurality of cycles, the counter component may be configured to change a counter value based on an index value determined during a preceding sampling cycle in the plurality of cycles until the least significant index value is determined.

In some implementations, during the incremental successive approximation register mode, the index component may be configured to dynamically vary an index value based on a proximity of consecutive samplings of one or more input signals to the analog to digital converter components by the sampling component. The index component may be configured to decrease the index value until the least significant bit index value is determined. The index component may be configured to increase the index value when a digital to analog converter reference voltage value of the analog to digital converter components corresponds to the voltage value of one or more samplings of one or more input signals to the analog to digital converter components by the sampling component.

In some implementations, in at least one of the voltage clamp mode and the current clamp mode, the neural interface system-on-chip may be configured to determine an impedance of one or more signal channels corresponding to one or more electrodes. Further, the neural interface system-on-chip may be configured to select a signal channel with a lowest measured impedance.

In some exemplary implementations, the neural interface system-on-chip may be configured to measure one or more signals during at least one of the following: an electroencephalography (EEG), an ear-electroencephalography (ear-EEG), an electrocardiography (ECG), an electrooculography (EOG), and any combination thereof.

Moreover, in some exemplary implementations, the neural interface system-on-chip may be configured for at least one of the following: a seizure detection, a seizure forecasting, a detection of an inter-ictal discharge (IED) biomarker, an analysis of internal carotid artery (ICA), and any combination thereof.

In some implementations, the current subject matter relates to a method for recording neural signals. The method may include providing a neural interface system-on-chip. The system may include, as discussed above, one or more electrodes integrated on a complimentary metal-oxide-semiconductor integrated circuit and coupled to one or more corresponding analog front end components. The analog front end components may be configured to be programmable for recording one or more neural signals and to operate in at least one of the following selectable programmable modes: a voltage clamp mode and a current clamp mode. The system may further include one or more analog to digital converter components coupled to the electrodes. The method may also include, using the neural interface system-on-chip, recording one or more neural signals. The neural interface system-on-chip may, for example, be configured for measurement of one or more signals during at least one of the following: an electroencephalography (EEG), an ear-electroencephalography (ear-EEG), an electrocardiography (ECG), an electrooculography (EOG), and any combination thereof. Additionally, the neural interface system-on-chip may also be configured, for example, for at least one of the following: a seizure detection, a seizure forecasting, a detection of an inter-ictal discharge (TED) biomarker, an analysis of internal carotid artery (ICA), and any combination thereof. In some implementations, the recording may include programming the analog front end components for recording the one or more neural signals.

Implementations of the current subject matter can include methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that may include one or more processors and one or more memories coupled to the one or more processors. A memory, which can include a non-transitory computer-readable or machine-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including, for example, to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to the virtualization of configuration data, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

One or more implementations of the current subject matter relate to methods, systems, articles of manufacture, and the like that may, among other possible advantages, provide for systems, devices, and/or methods for providing a neural interface system-on-chip with dynamic incremental successive-approximation register acquisition.

Figure 3A:
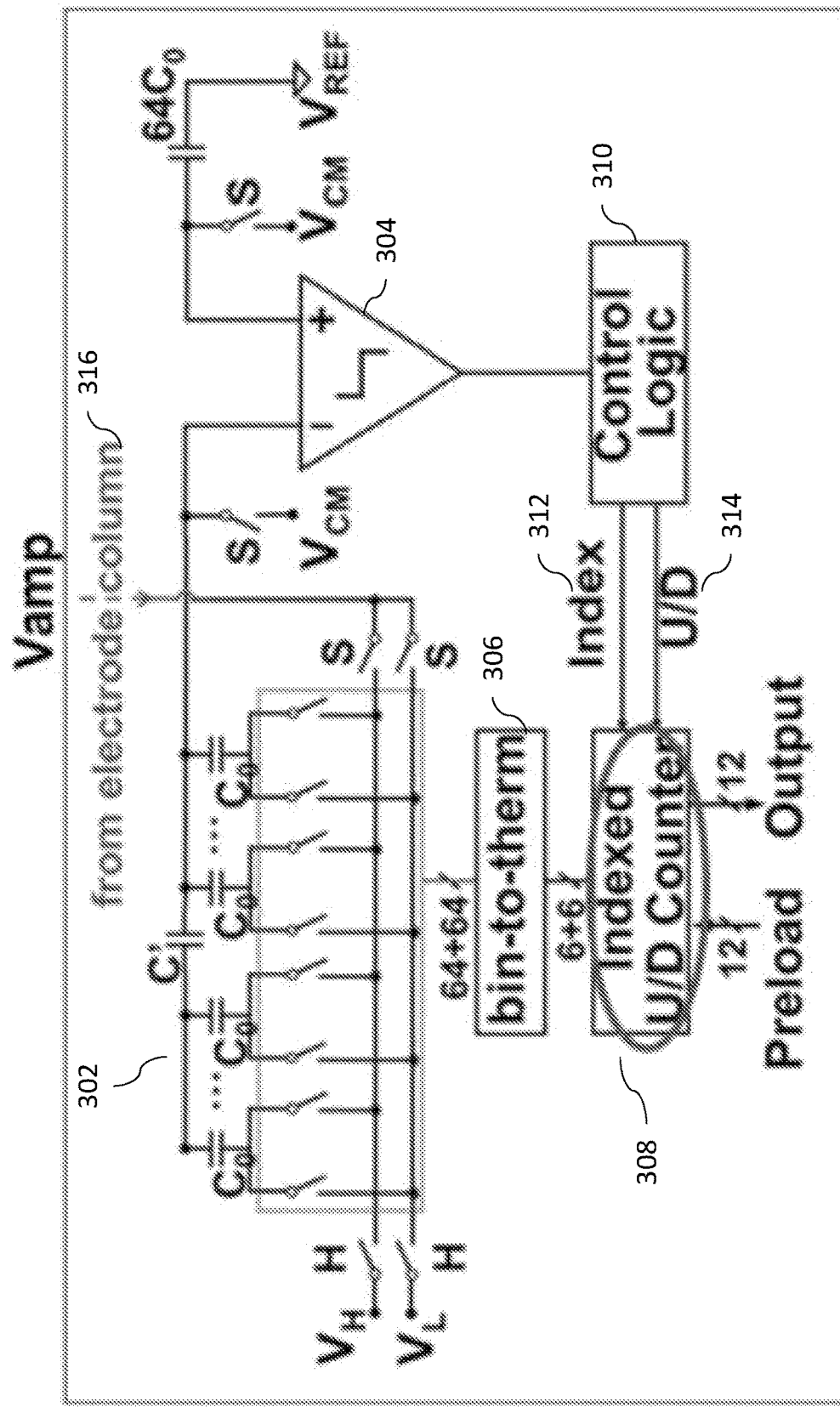
FIG. 3a illustrates an exemplary on-chip analog to digital converter(s) shown in FIG. 1, according to some implementations of the current subject matter.
Figure 3B:
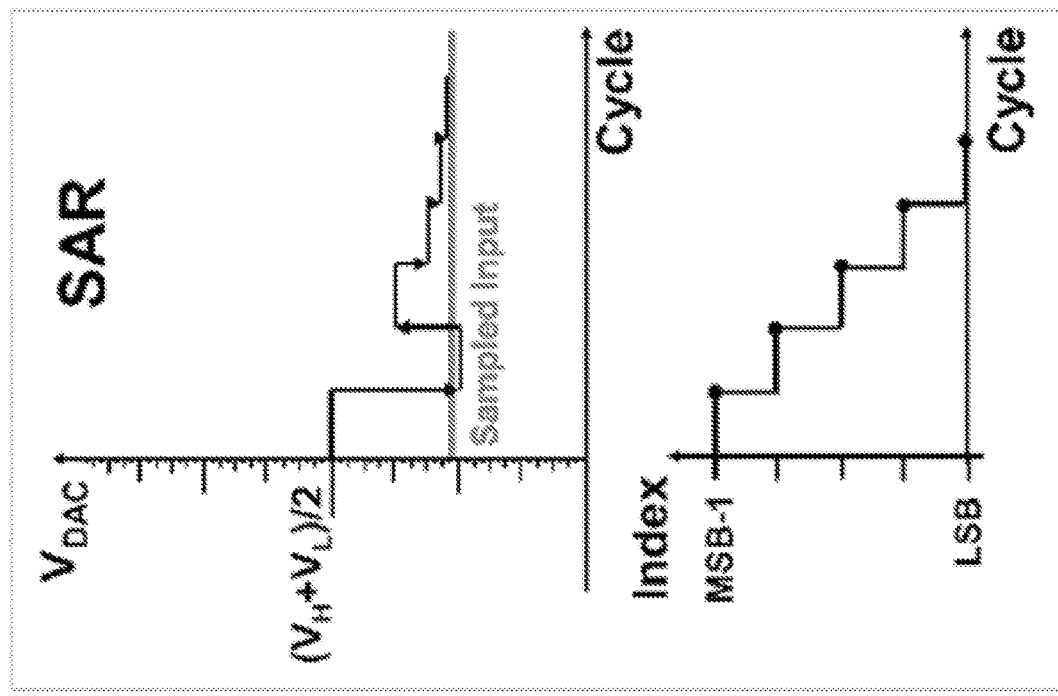
FIG. 3b illustrates an exemplary plot illustrating a search path for a SAR operating mode.

A successive-approximation register (SAR) analog-to-digital converter (ADC) is widely used as one of the most energy efficient architectures available for digitization of analog signals at medium (8-bit to 16-bit) resolution. A conventional SAR ADC performs a binary search (e.g., as shown in FIG. 3b, top portion) through level comparisons for the nearest quantized level in a series of successively twice smaller steps, cycling from most-significant bit (MSB) through least-significant bit (LSB) by zooming in two-fold starting from the mid-range level (e.g., as shown in FIG. 3b, bottom portion). As such, SAR binary search is most efficient for full-Nyquist memory-less, uniformly distributed signals, but is a poor match for these sensor signals that are mostly very small in amplitude with substantial low-frequency content and infrequent large fast transients. One of the existing systems proposes LSB-first SAR to increase energy efficiency. However, despite several advantages, one of the drawbacks of the LSB-first SAR technique is that the number of cycles (i.e., successive approximation steps) per conversion depends on the previous signal amplitude, and can be very long even for subtle (LSB-level) changes. For instance, it may require 12 cycles to complete conversion in case the previous output is 100000000000 and the current sample input is 011111111111. Another disadvantage of the LSB-first SAR is that it might not be able to accurately follow rapid changes in the input, such as, sharp action potentials, because of digital-to-analog conversion (DAC) charge loss due to the DAC voltage exceeding supply rails. Another existing system includes an improved LSB-first SAR ADC strategy to overcome the latter problem. However, this system still suffers from potentially strong data dependence in the number of conversion cycles to reach nominal precision. Further, similar to conventional SAR, both of the existing LSB-first SAR ADCs are prone to errors in the analog comparison process, which can result in errors in the digital readout as large as half of the signal range.

In some implementations, to overcome the above challenges of existing systems, the subject matter relates to a dynamic incremental-SAR (iSAR) ADC which provides for fast and reliable conversion for slowly varying signals. The iSAR may incrementally advance from the previous ADC result, proceeding in a number of successive approximation steps (e.g., cycles) that may be much lower than the number of ADC bits. For each cycle, the iSAR may dynamically adjust the SAR on a variable radix-2 base to expand and/or contract the search region depending on whether the signal value is detected within the region. In contrast to conventional SAR systems (including the LSB-first SAR ADC), the number of iSAR conversion cycles may be independent of signal amplitude, and may decrease with decreasing magnitude of change (and/or slope) in signal amplitude. Further, iSAR may recover from errors in the analog comparison at the expense of additional conversion cycles, thereby avoiding catastrophic readout errors that are present in conventional SAR systems (including LSB-first SAR ADC). For typical biosignals, iSAR may reach ADC resolution-limited precision in just 3 successive approximation steps between consecutive samples at the Nyquist range, thereby leading to substantial energy savings in signal acquisition.

To cover wider signal range without compromising energy efficiency of existing signal dependent LSB-first SAR ADC, the current subject matter relates to a dynamic incremental SAR (iSAR) with adaptive start index and overflow protecting circuit. The dynamic iSAR may start from the previous conversion level rather than mid-level, and proceed from thereon with a smaller step, at a radix-2 scale index lower than MSB-1 (as shown in FIG. 3e, bottom portion). If the sampled input is sufficiently close to the previous conversion level (curves 337, 339 as shown in FIG. 3e), then the iSAR's search may continue to successively zoom in with the index stepping down each time the comparator flips, reaching the LSB in a number of cycles typically less than the number of bits, less than needed for conventional SAR systems (including LSB-first SAR ADC). If the input changes from its previous level to a greater extent (e.g., greater in step than the radix-2 scale of the start index), the search may require zoom-out operations to catch up, where the index may undergo upward excursions until the comparator flips to resume a downward settling trend towards the LSB (curves 336, 338, as shown in FIG. 3e).

In particular, the iSAR may step up the index (e.g., increase the step size twofold) if and, as long as, the comparator retains the same polarity (and/or the index reaches its maximum at MSB-1), and may step down the index (e.g., decrease the step size twofold) as soon as and whenever the comparator flips polarity (and/or the series terminates when the index reaches its minimum at LSB). The iSAR may further maintain the index when the comparator stays for consecutive cycles at the same polarity. This may slow down the process somewhat and produce more robust convergence in the presence of noise and errors in the comparison. The iSAR may settle in a limit cycle of alternating LSB steps up and down. For the terminal cycle, a downward step may be reverted to recover one bit of precision.

Figure 1:
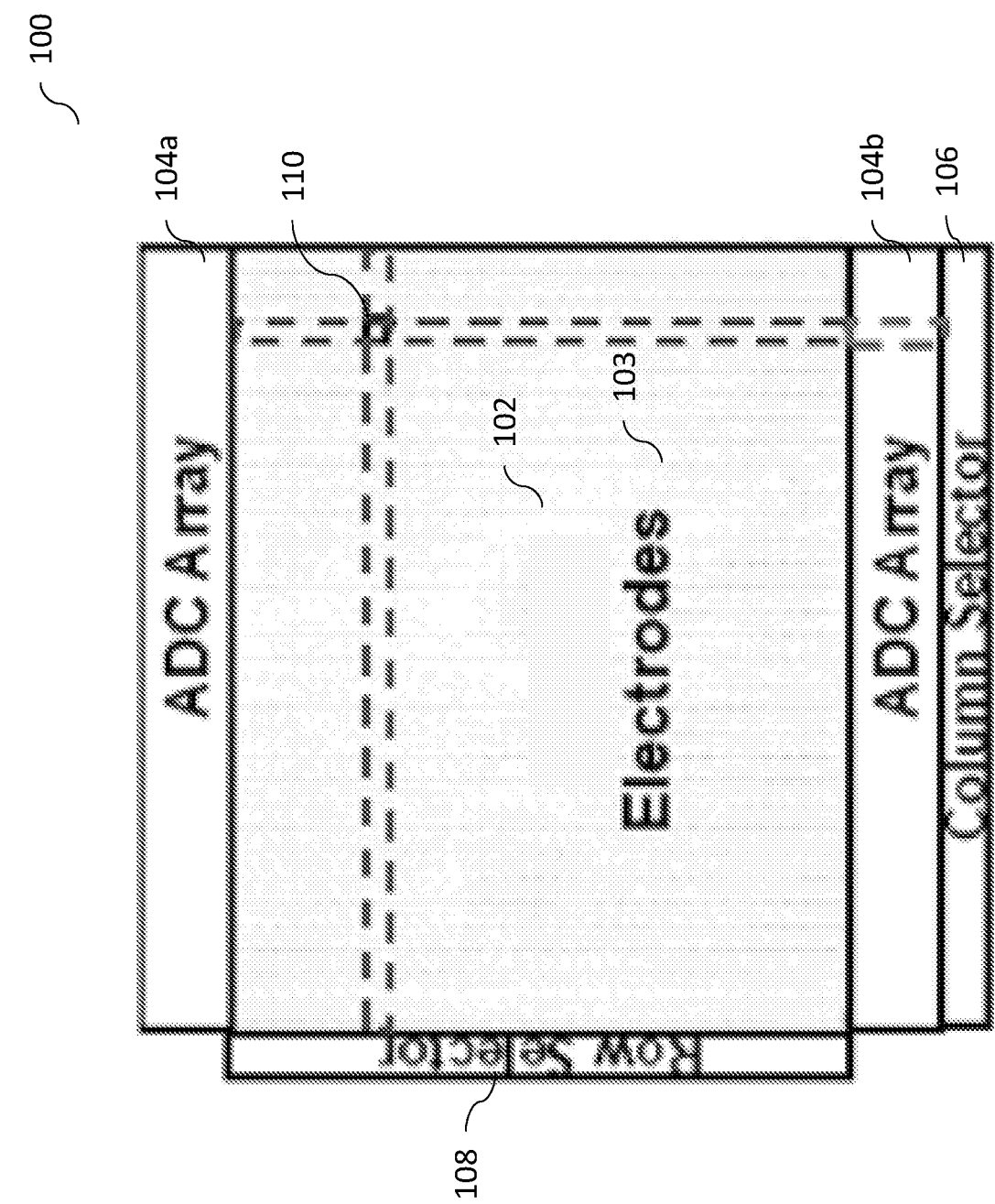
FIG. 1 illustrates an exemplary neural interface system-on-chip, according to some implementations of the current subject matter.
Figure 2A:
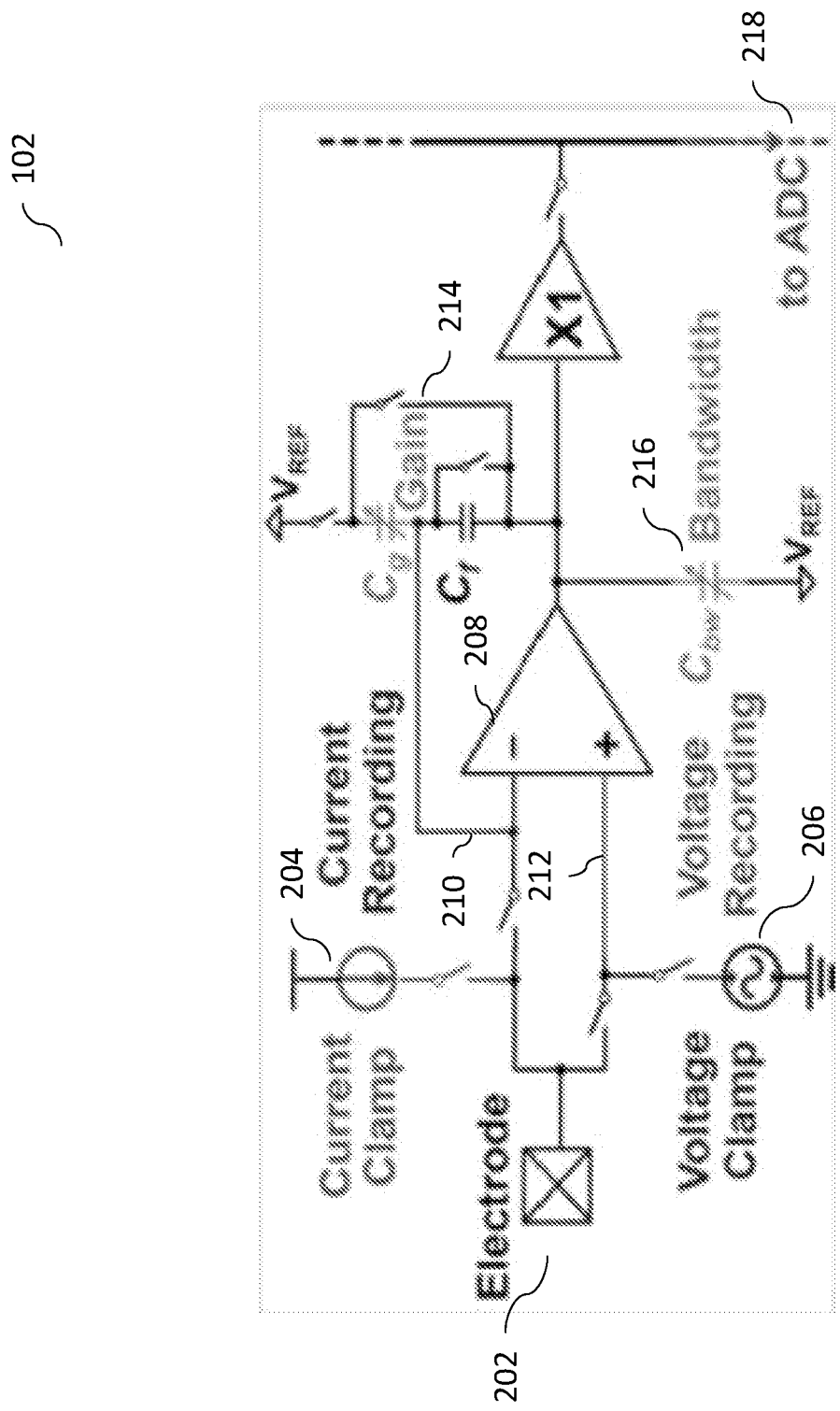
FIG. 2a illustrates an exemplary circuitry of one of the analog front ends shown in FIG. 1, according to some implementations of the current subject matter.

In some exemplary, non-limiting implementations, the current subject matter relates to a system and a method for recording of biopotential signals from an array of 1,024 electrodes (e.g., as shown in FIG. 1 and discussed below). An exemplary 32×32 electrode array may be integrated on a 2 mm×2 mm 65 nm complimentary metal-oxide-semiconductor (CMOS) silicon neural interface system-on-chip (NI-SoC). The NISoC may include an array of 32 column-parallel iSAR ADCs for on-chip digitization, which may cover an entire frequency range of neural biopotentials from LFPs to action potentials. The NISoC may also provide configurable spatially patterned simultaneous electrical stimulation capability. The NISoC may support voltage and current clamping through a programmable interface (e.g., as shown in FIG. 2a and discussed below). Global control variables may be used to configure gain and/or bandwidth for either voltage and/or current recording, thereby generating a proportional voltage output. One 12-bit iSAR ADC may, for example, digitize the 32 outputs in a column.

Further, the iSAR may be configured to implement one or more components of conventional SAR. It may also include a pre-settable indexed up/down counter (rather than a standard register), and an additional index control logic (e.g., as shown in FIG. 3a and discussed below). The control logic may include an overflow protection avoiding the register to exceed the DAC range, otherwise causing DAC charge loss. The iSAR may include a frame memory buffer to store and/or recall 1,204 previous output values for preload. In some exemplary implementations, the on-chip integration of a 12 k-bit buffer may provide substantial energy savings.

As stated above, in some implementations, the current subject matter may be configured to provide a neural interface that may be used to "merge" one or more characteristics of a human brain and a machine by establishing a bidirectional communication between artificial neuron(s) and biological neuron(s). This may be accomplished by one or more tools that may be capable of recording and stimulating biological neurons, such as, for example, patch clamp system with glass probes and a planar multi-electrode array (MEA). The current subject matter's mobile and/or implantable system-on-chip may provide an integrated neural interface that may offer simultaneous current recording and/or voltage recoding and/or stimulation capabilities, which may be essential to characterize ion currents through membranes, as well as voltammetry to measure redox currents from neurotransmitter electrochemical activity, etc. Moreover, the neural interface system-on-chip may be configured to detect/measure one or more signals on one or more signal channels and determine corresponding signal impedance on that channel, whereby a signal channel with the lowest impedance may be selected for an improved signal quality. The impedance on that channel may be determined by periodically either current clamping and/or voltage clamping the electrode and registering the corresponding signal change. Further, the current subject matter's system-on-chip may offer a reduced physical size and/or power consumption.

In some exemplary, non-limiting implementations, the neural interface system-on-chip may be configured for measurement of one or more signals during at least one of the following procedures: an electroencephalography (EEG), an ear-electroencephalography (ear-EEG), an electrocardiography (ECG), an electrooculography (EOG), and/or any other procedures and/or any combination thereof. Further, the neural interface system-on-chip may also be configured for at least one of the following: a seizure detection, a seizure forecasting, a detection of an inter-ictal discharge (IED) biomarker, an analysis of internal carotid artery (ICA), and any combination thereof. The above procedures may be performed on a subject (e.g., a patient, a user, etc.) at any desired location (e.g., hospital, medical office, laboratory, clinic, ambulatory setting, home setting, etc.). Moreover, in some exemplary, non-limiting, implementations, the neural interface system-on-chip may include and/or otherwise be coupled to one or more computing components (e.g., one or more processors, memory(ies), communication components, etc.) that may include one or more of hardware and/or software that may be used for the purposes of receiving/transmitting programming commands, storing various data (e.g., signal data, voltage data, current data, impedance data, etc.), receiving data, transmitting data, and/or used for any other purposes.

FIG. 1 illustrates an exemplary neural interface system-on-chip 100, according to some implementations of the current subject matter. The system 100 may be configured to include one or more analog front ends 102 coupled to one or more electrodes 103 and one or more analog-to-digital (ADC) converters 104. In some exemplary implementations, the system 100 may be disposed on a substrate (not shown in FIG. 1). Each front end 102 may be configured to function as both a current-clamp and/or a voltage-clamp. Each ADC 104 may be configured to be shared by the AFEs 102 in one column. As shown in FIG. 1, the system 100 may include a first ADC array 104a and a second ADC array 104b. A column selector component 106 and a row selector component 108 may be configured to select a particular AFE-ADC combination 110. The system 100 may be programmed to achieve a low-energy digitization.

In some exemplary, non-limiting implementations, the system 100 may be configured as a 2 mm×2 mm on a 65 nm substrate that may integrate 1024 analog front-ends 102 and 32 analog-to-digital converters 104. Thus, each ADC 104 may be shared by 32 AFE in one column.

FIG. 2a illustrates an exemplary circuitry of one of the analog front ends 102 shown in FIG. 1, according to some implementations of the current subject matter. The AFE 102 may include an electrode 202, a current clamp/stimulator component 204, a voltage clamp/stimulator component 206, an amplifier (e.g., a non-inverting gain amplifier) 208, a gain component 214, and a bandwidth component 216. The AFE 102 may be coupled to an ADC 104 (not shown in FIG. 4) via a connection 218.

In some exemplary implementations, the current clamp/stimulator component 204 may be configured as a cascoded current mirror. The voltage clamp/stimulator component 206 may be implemented with one or more (e.g., two) voltage sources. The amplitude and/or polarity of current and voltage stimulators 204, 206 may be globally programmable. The amplifier 208 may be configured to measure voltage (e.g., via branch 212) and/or configured as an integrator to measure current (e.g., via branch 210). The voltage and/or current sensing mode of the amplifier 208 may be configured through one or more low leakage switches (not shown in FIG. 2a), the timing of which may also be used to implement correlated double sampling of the voltage and/or current signal. For instance, the high current bias may only be enabled when sampling happens, which may substantially reduce power consumption. The gain component 214 and/or bandwidth component 216 may be controlled by connecting and/or disconnecting one or more select capacitors.

Figure 2B:
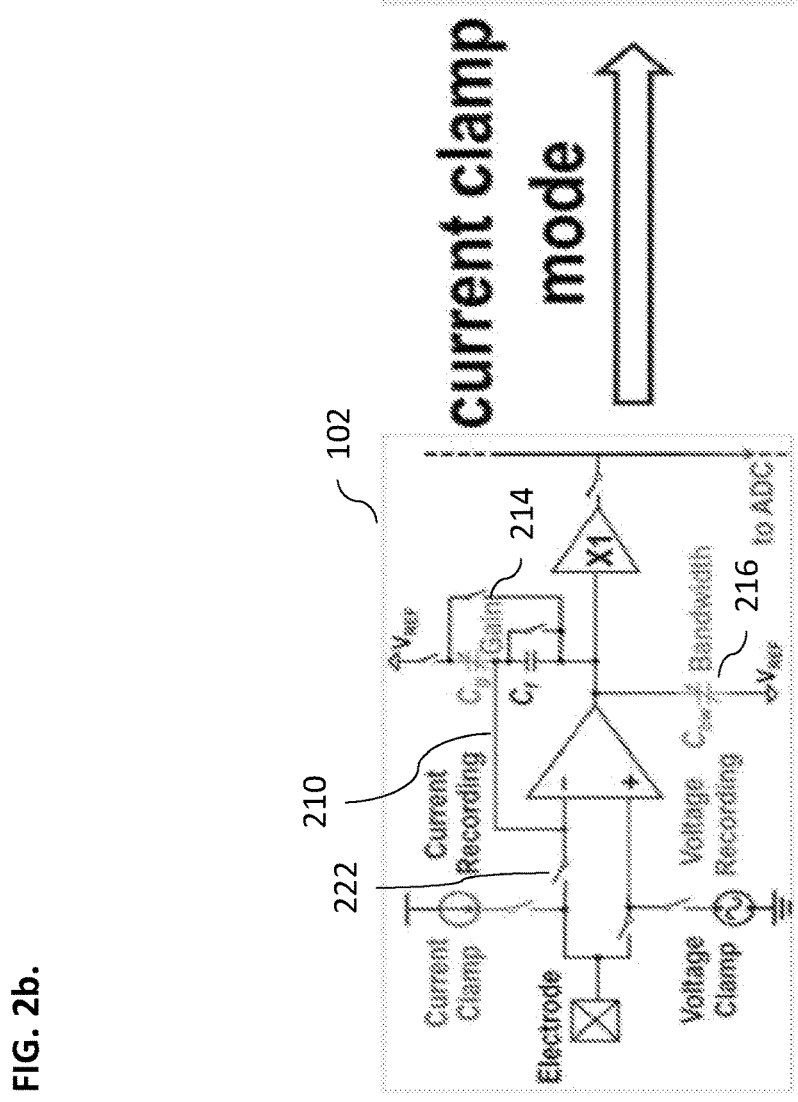
FIG. 2b illustrates an exemplary analog front end's current clamp mode, according to some implementations of the current subject matter.

FIG. 2b illustrates an exemplary analog front end's current clamp mode 220, according to some implementations of the current subject matter. In the current clamp mode 220, cell membrane potential may be recorded by injecting current into a cell through the recording electrode. This is different from the voltage clamp mode, where the membrane potential is held at a predetermined level. In the current clamp mode, the membrane potential may vary, whereby the amplifier may records whatever voltage the cell may generates on its own and/or as a result of stimulation. This mode may be used to determine how a cell responds when electric current enters a cell (e.g., how neurons respond to neurotransmitters that act by opening membrane ion channels).

Referring back to FIG. 2b, the AFE 102 may be used to measure voltage through branch 212. To do so, one or more switches 222 may be turned off (e.g., globally turned off), and thus, branch 210, to thereby make front end function as a non-inverting amplifier. A correlated double sampling (CDS) 224 (a, b) may be implemented to remove offset drift and reduce low frequency noise. The gain may be determined by a ratio of capacitances, and may be digitally programmed by selecting one or more gain capacitors $C_g$ that may be incorporated into the gain component 214 along with capacitor(s) $C_f$. The programmable gain may be expressed using the following relationship $(C_g+C_f)/C_f$. Similarly, bandwidth may be tuned by selecting among a bank of loading capacitors $C_{bw}$ that may be incorporated into the bandwidth component 216.

Figure 2C:
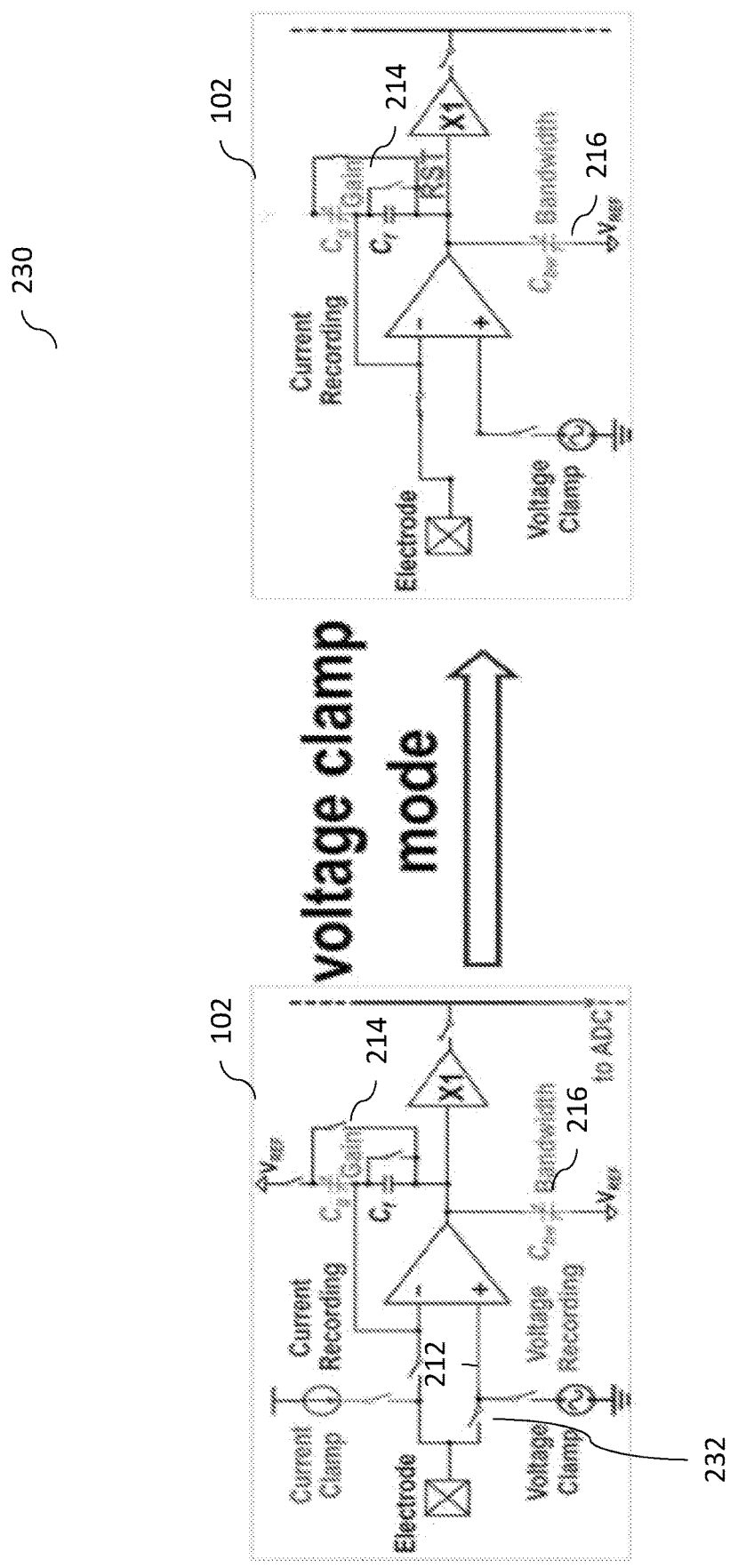
FIG. 2c illustrates an exemplary analog front end's voltage clamp mode, according to some implementations of the current subject matter.

FIG. 2c illustrates an exemplary analog front end's voltage clamp mode 230, according to some implementations of the current subject matter. In the voltage clamp mode 230, the system 100 (shown in FIG. 1) may be configured to measure ion currents passing through the membranes of excitable cells, such as neurons, while holding the membrane voltage at a set level. In this mode, one or more of the switches 232 may be turned off (and thus, branch 212) to thereby make front end function as an integrator to measure current through current branch 210. In this mode, the current gain may be digitally programmable by configuring integration time (Δt) and value of integration capacitor ($C_g$) of the gain component 214. The gain may be expressed as follows:

$$I = \frac{\Delta Q}{\Delta t} = \frac{\Delta V}{\Delta t}(C_g + C_f) \quad (1)$$

In voltage clamp mode 230, the system 100 may be configured to measure current from, for example, tens of fA to tens of nA. Self-calibration of stimulation currents, for charge-balanced stimulation, may be implemented by recording current directly from the current stimulator.

FIG. 3*a* illustrates an exemplary on-chip analog to digital converter(s) 104 shown in FIG. 1, according to some implementations of the current subject matter. The ADC 104 may be configured to include a sample-and-hold circuit component 302, an amplifier 304, a bin-to-thermometer binary converter 306, an indexed up/down counter 308, and control logic 310 that may supply index value(s) 312 and up/down value(s) 314. A voltage $V_{amp}$ 316 may be supplied from the electrode column (as shown in FIG. 1). The on-chip ADCs (e.g., 32 ADC as shown in FIG. 1) may be configured to operate in the following modes: a successive approximation register mode (SAR) and a dynamic incremental SAR (iSAR) mode.

The sample and hold circuit 302 may be an analog device that may sample voltage of a continuously varying analog signal and hold its value at a constant level for a specified minimum period of time. This circuit may be used to eliminate variations in input signal that can corrupt conversion process. The circuit 302 may store electric charge in a capacitor and may include at least one switching device and an operational amplifier. To sample the input signal the switch may connect the capacitor to the output of a buffer amplifier. The buffer amplifier may charge and/or discharge the capacitor so that the voltage across the capacitor is substantially equal, and/or proportional to, input voltage. In a hold mode, the switch may disconnect the capacitor from the buffer.

In a conventional SAR ADC, a sample and old circuit may be configured to acquire an input voltage, compare it to an internal DAC and output the result of the comparison to SAR. The SAR may supply an approximate digital code of the input voltage to the internal DAC. The DAC may supply an analog voltage equal to the digital code output of the SAR to the comparator for comparison with a reference voltage (e.g., $V_{ref}$). The conventional SAR may be initialized so that the MSB is equal to 1. This code is fed into the DAC, which then supplies the analog equivalent of this digital code ($V_{ref}/2$) into the comparator for comparison with the sampled input voltage. If this analog voltage exceeds the input voltage, then the comparator causes the SAR to reset this bit; otherwise, the bit is 1. The next bit may be set to 1 and the comparison may be performed again, thereby continuing a binary search until all bits in the SAR has been tested. The resulting code is the digital approximation of the sampled input voltage and is finally output by the SAR at the end of the conversion.

In some implementations, the current subject matter may incorporate the counter 308 that may be a pre-settable indexed up/down counter as opposed to a conventional standard register. The index control logic 310 may include an overflow protection to avoid the register to exceed the DAC range, which otherwise may cause DAC charge loss. Using the counter 308, whether the ADC 104 is operating in the SAR or iSAR mode, the conversion process may be used to make the voltage difference between the sampled input and the DAC converge to zero, by updating DAC digital value.

As shown in FIG. 3*a*, the voltages supplied to the comparator 304, may be expressed as follows:

$$V_- = V_{DAC} - V_{amp} + V_{CM}$$

$$V_+ = V_{CM}$$

whereby $V_+ - V_- = V_{amp} - V_{DAC}$ \quad (2)

The DAC voltage may be determined as follows:

$$V_{DAC} = V_L + \frac{digi}{2^{12}}(V_H - V_L) \quad (3)$$

Thus, when $V_H = V_{DD}$ and $V_L = 0$, $V_+ - V_- = V_{amp} - \frac{digi}{2^{12}} V_{DD}$ \quad (4)

Further, in some exemplary, non-limiting implementations, the iSAR may require a frame memory buffer to store and recall 1,024 previous 12-b output values for preload in sequential scanned order. One of the advantages of the iSAR is that the memory may consume a negligible silicon area by the on-chip integration of a 12-kb buffer while affording substantial energy savings.

FIG. 3*b* illustrates an exemplary plot 320 illustrating a search path for a SAR operating mode. In particular, the plot 320 shows a sequential SAR operation process, where, starting from a middle of the range, the search may repeatedly zoom in by a factor 2 until all bits are determined. The step size may be defined as $2^{index}$ The index may decrease by 1 from MSB-1. Thus, the step size may be divided by 2.

Figure 3C:
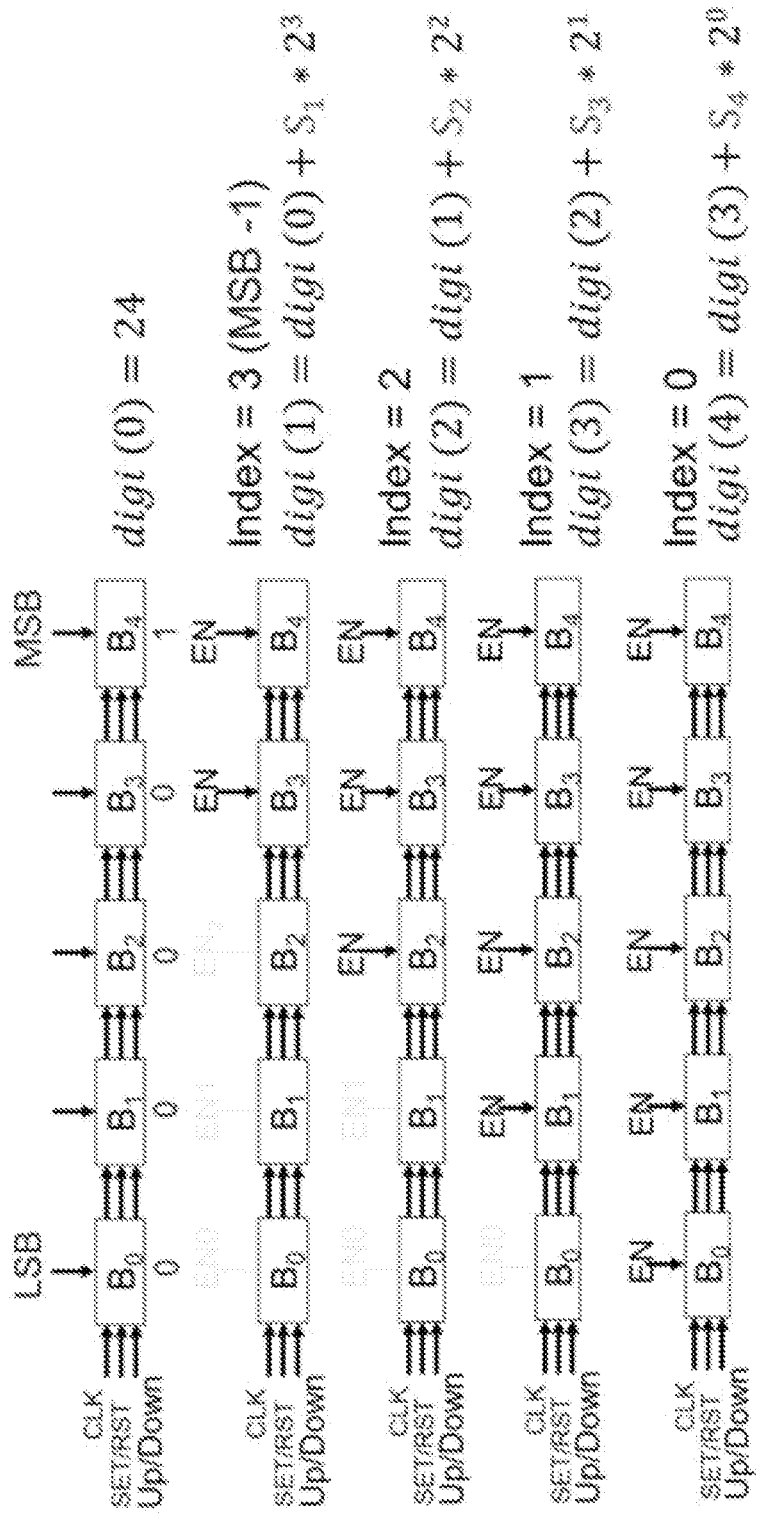
FIG. 3c illustrates operation of the ADC in the SAR mode.

FIG. 3*c* illustrates operation 325 of the ADC in the SAR mode. In particular, for ease of illustration, FIG. 3*c* shows an exemplary 5-bit ADC (i.e., bits $B_0$, $B_1$, $B_2$, $B_3$, $B_4$, where $B_0$ being the least significant bit and $B_4$ being the most significant bit). Since it is a 5 bit ADC, the decision bits $S_n$ may be determined using the following:

$$V_{amp} - \frac{digi(n-1)}{2^5} V_{DD}.$$

In the first cycle, the counter 308 (as shown in FIG. 3*a*) may be initialized to its mid-range, e.g., 10000 (i.e., digi(0)=24). Then, the index may be set to MSB-1, which for a 5-bit ADC is 3. This value of the index may disable the three least significant bits of the counter (i.e., $B_0$, $B_1$, $B_2$) and enable (EN) the remaining bits. These bits may continue to hold their respective values. The 2-bit enabled counter may go up or down by a step of $2^{index}$ depending on the comparison result of cycle 1. During the next cycle, the index may decrease by 1, and the 3-bit enabled counter may go up or down depending on the previous comparison result. This procedure may be repeated until the LSB is determined, as shown by the equations in FIG. 3*c* corresponding to each step.

Figure 3D:
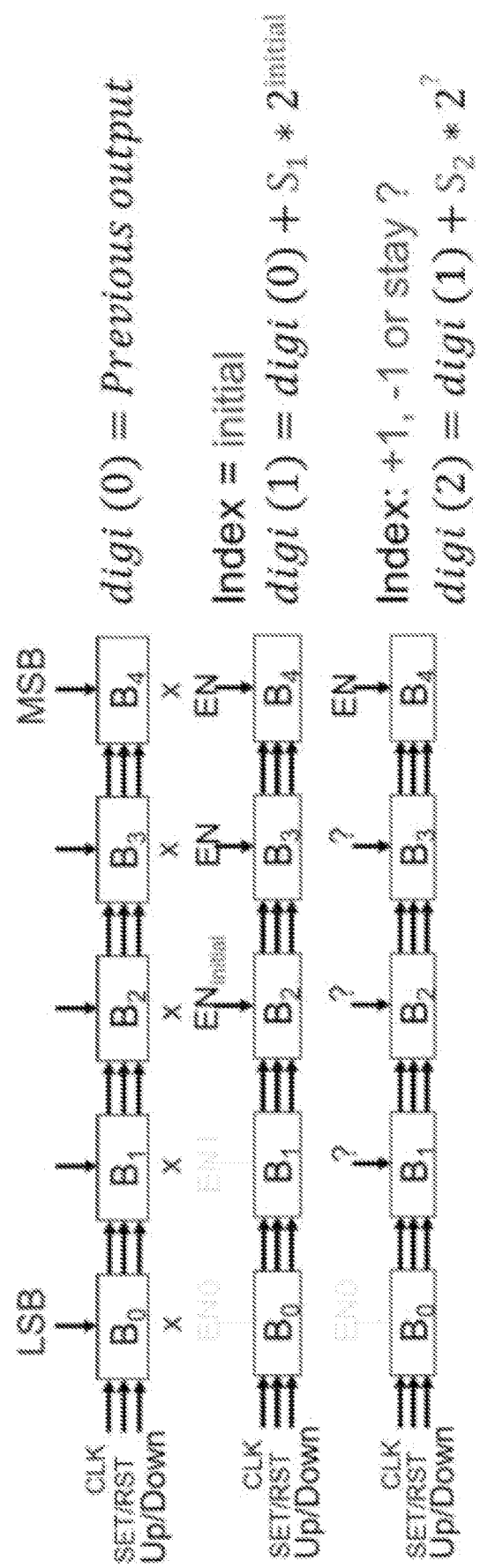
FIG. 3d illustrates operation of the ADC in the iSAR mode, according to some implementations of the current subject matter.
Figure 3E:
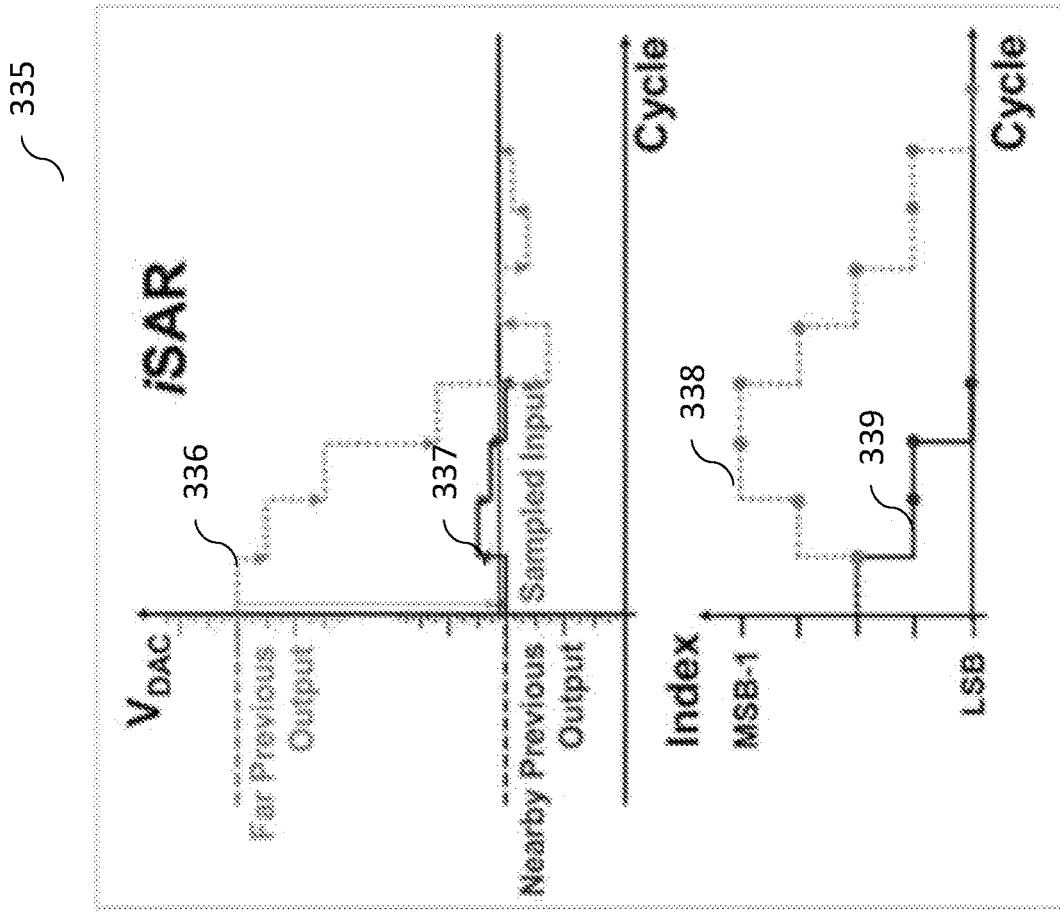
FIG. 3e illustrates an exemplary plot illustrating a search path for an iSAR operating mode shown in FIG. 3d (i.e., for a 5-bit ADC), according to some implementations of the current subject matter.

FIG. 3*d* illustrates operation 330 of the ADC in the iSAR mode, according to some implementations of the current subject matter. Again, for ease of illustration, a 5-bit ADC (similar to the 5-bit ADC shown in FIG. 3*c*) is shown. The operation 330 proceeds as follows. First, the counter 308 (shown in FIG. 3*a*) may be initialized to the previous conversion value, instead of the mid-range, as in the case of the SAR operation mode 325 shown in FIG. 3*c*. The bits $S_n$ may be determined in a similar way as for the operation 325, however, the sequence of indices/index is no longer descending from MSB to LSB. In the first cycle, the index may be set to an initial value (e.g., digi(1)=digi(0)+ $S_1 * 2^{initial}$, where digi(0) represents previous output). This value may be programmable. In the following cycles, the iSAR may allow index variation by at most one unit each cycle, based on the history of decision bits $S_n$. Thus, during operation of the iSAR operates, the index may be increased (i.e., "+1") every cycle until $V_{DAC}$ crosses $V_{amp}$ and after that, the index may be decreased (i.e., "−1") only when comparator flips output/sign, otherwise the index is unchanged.

FIG. 3e illustrates an exemplary plot 335 illustrating a search path for an iSAR operating mode shown in FIG. 3d (i.e., for a 5-bit ADC), according to some implementations of the current subject matter. Here, the maximum step is $(V_H+V_L)/4$ since maximum index is MSB-1. As shown in FIG. 3e, when the new sample is farther away from the previous one (as shown by curves 336 and 338), the iSAR may first zoom out very step until $V_{DAC}$ crosses $V_{amp}$. Again, the index value may define step size. The index value may start from an initial value and increase by 1 every cycle before $V_{DAC}$ crosses $V_{amp}$, until it reaches maximum value MSB-1. It only decreases when $V_{DAC}$ crosses sampled input.

When the new sample is close to the previous one (as shown by curves 337 and 339 in FIG. 3e) (e.g., closer than $2^{initial}$ index), the iSAR may be configured to converge quickly, with the index only going down towards the LSB. The iSAR may go down just for every crossing, which is more robust to comparator error. This may allow for error correction and overflow protection.

As shown in FIGS. 3b and 3e, the SAR search path (shown in FIG. 3b) requires N cycles per conversion for an N bit resolution. The number of cycles for the iSAR search path may depend on its signal slope. Thus, for typical neural signals of interest, the signal does not vary much between samples except during short transients, so that on average much fewer than N cycles may be required for an N bit resolution. The iSAR's fast convergence for slow signals does not make any assumptions on the signal amplitude itself (i.e., amplitude independent), unlike LSB-first SAR, which may require more than 12 cycles even for some very nearby sample. Thus, as stated above, a further advantage of the iSAR is that it may correct errors due to DAC and comparator noise.

Figure 4:
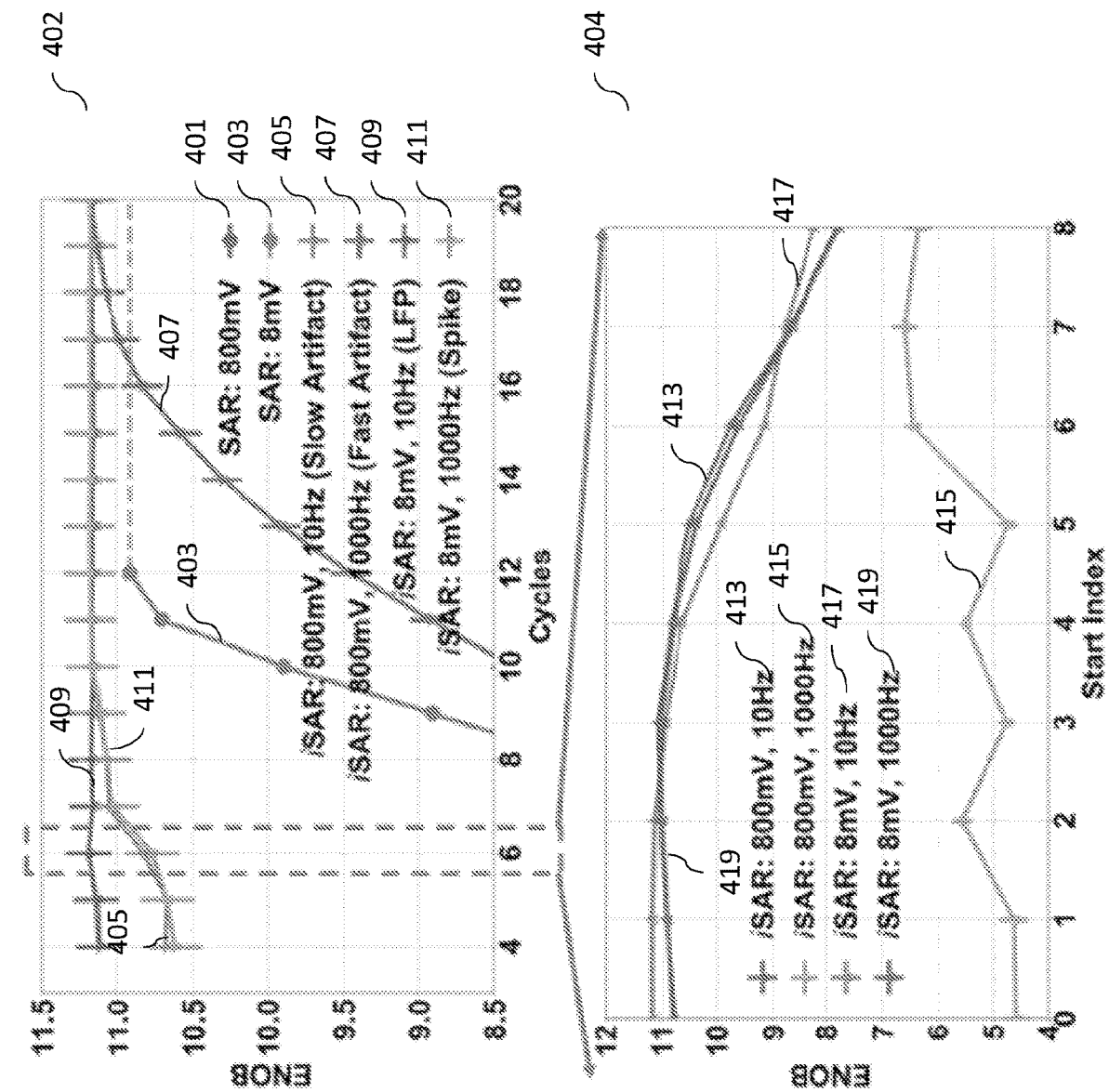
FIG. 4 illustrates exemplary plots showing an effective number of bits (ENOB) for conventional SAR and incremental SAR (iSAR) ADC, as shown in FIG. 1.

FIG. 4 shows a measured performance of one column ADC configured in SAR and iSAR modes, as a function of the number of cycles (successive approximation steps). iSAR requires choice of start index, the optimal value of which is signal dependent but can be dynamically tuned by tracking average peak consecutive level differences in the signal. For slowly varying signals, iSAR reaches higher effective number of bits (ENOB) than SAR (11.2 rather than 10.9), in less than half the number of cycles (fewer than 6 rather than 12). ENOB is defined here as the effective number of bits of the ideal quantizer producing the same SNDR as the measured output at the signal input level. In particular, FIG. 4 illustrates exemplary, experimental ENOB versus cycles plot 402 and ENOB-start-index plot 404. The ENOB may be determined based on signal to (noise+distortion) (SNDR) using the following equation:

$$ENOB = \frac{SNDR - 1.76 \text{ dB}}{6.02 \text{ dB}} \quad (5)$$

In particular, the plots 402, 404 illustrated measured ENOB for the ADC in SAR and iSAR modes for different neural signals. As shown in FIG. 4a, the plot 402 illustrates measured ENOB in relation to the number of cycles for SAR with signal voltage 800 mV (curve 401) and 8 mV (curve 403). By comparison, the ENOB for the iSAR are shown for signal voltage 800 mV, 10 Hz (slow artifact) (curve 405), 800 mV, 1000 Hz (fast artifact) (curve 407), 8 mV 10 Hz (LFP) (curve 409), and 8 mV 1000 Hz (spike) (curve 411).

Plot 404 shows curves for measured ENOBs in relation to the start index for the iSAR. Specifically, curve 413 represents the measured ENOB for the iSAR with signal voltage 800 mV, 10 Hz; curve 415—800 mV, 1000 Hz; curve 417—8 mV 10 Hz; and curve 419—8 mV 1000 Hz.

It should be noted that the 12-bit SAR ADC achieves its optimal 11-b ENOB in 12 cycles (curves 401-403) independent of the input signal. However, as shown in FIG. 4, the ENOB of the iSAR may be input signal slope dependent and achieves 11 ENOB in approximately 6 cycles for all signals of interest (curves 405-411).

Figure 5:
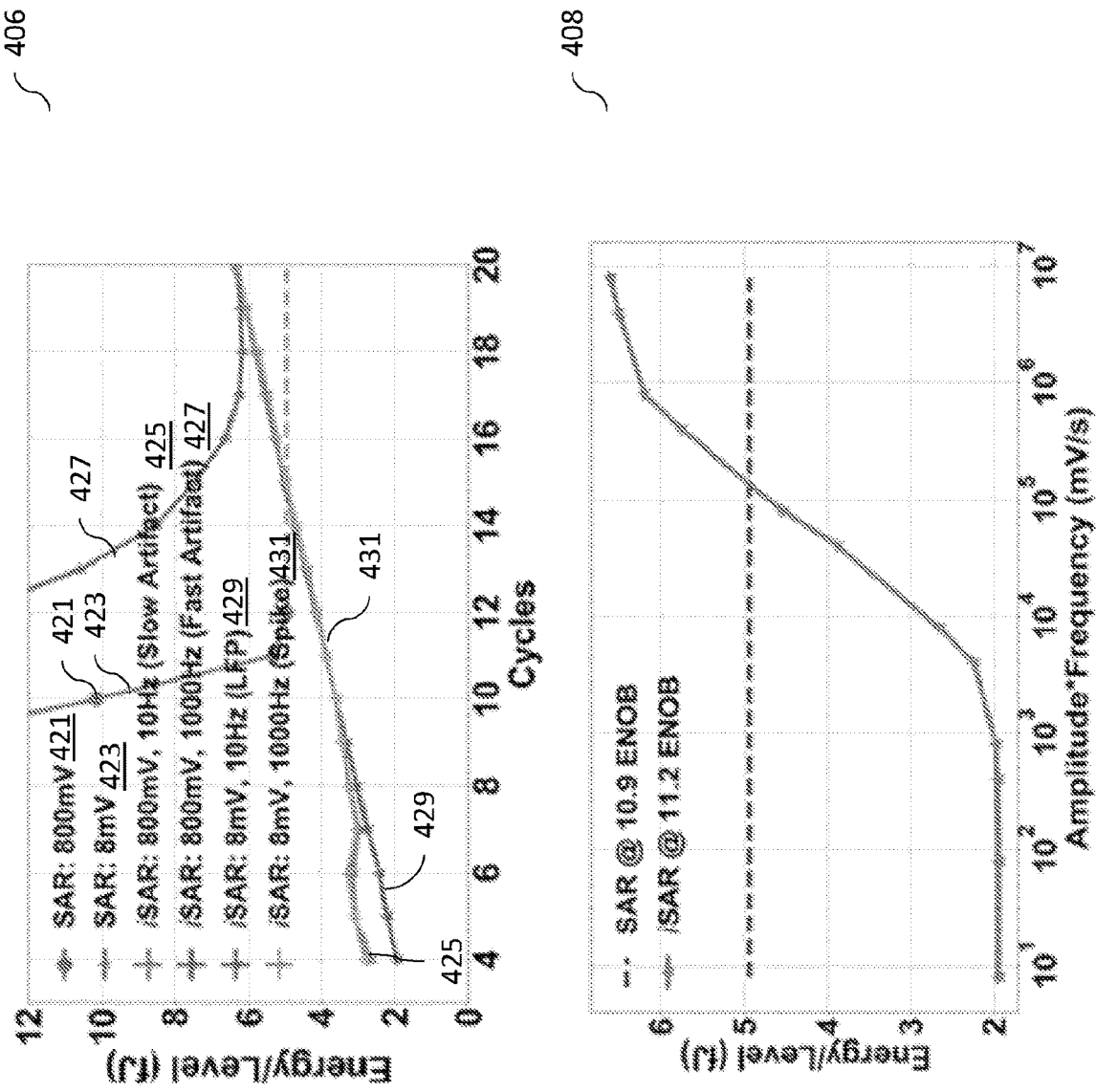
FIG. 5 illustrates exemplary plots showing energy efficiency figure-of-merit (FOM) for conventional SAR and incremental SAR (iSAR) ADC, as shown in FIG. 1.

FIG. 5 shows the corresponding energy efficiency figure-of-merit (FOM), as the measured ADC energy per conversion level at ENOB. As SAR energy per conversion is almost directly proportional to the number of cycles, the iSAR reaches an ADC FOM more than twice lower than SAR (2 fJ/level rather than 5 fJ/level) for signals changing slower than 1 mV/ms, typical of LFP, ECoG, dopamine, and other biopotential and electrochemical neural signals. Changes in these signals are frequently limited to a few levels only, so that a few cycles of LSB-level iSAR iteration help to boost signal-to-noise ratio beyond the quantization level.

In particular, FIG. 5 illustrates exemplary experimental plots 406 and 408 representing energy/level (fJ) in relation number of cycles (plot 406) and amplitude*frequency (mV/s) (plot 408). As shown in the plots, the energy/level may depend on the signal slope, whereby a substantial amount of energy (e.g., 60%) may be saved for neural signal recording. The plots 406 and 408 illustrate experimental measurements for the same SAR and iSAR combinations shown in FIG. 4a, i.e., SAR signal voltage 800 mV (curve 421), SAR 8 mV (curve 423), iSAR 800 mV, 10 Hz (slow artifact) (curve 425), 800 mV, 1000 Hz (fast artifact) (curve 427), 8 mV 10 Hz (LFP) (curve 429), and 8 mV 1000 Hz (spike) (curve 431).

Figure 6:
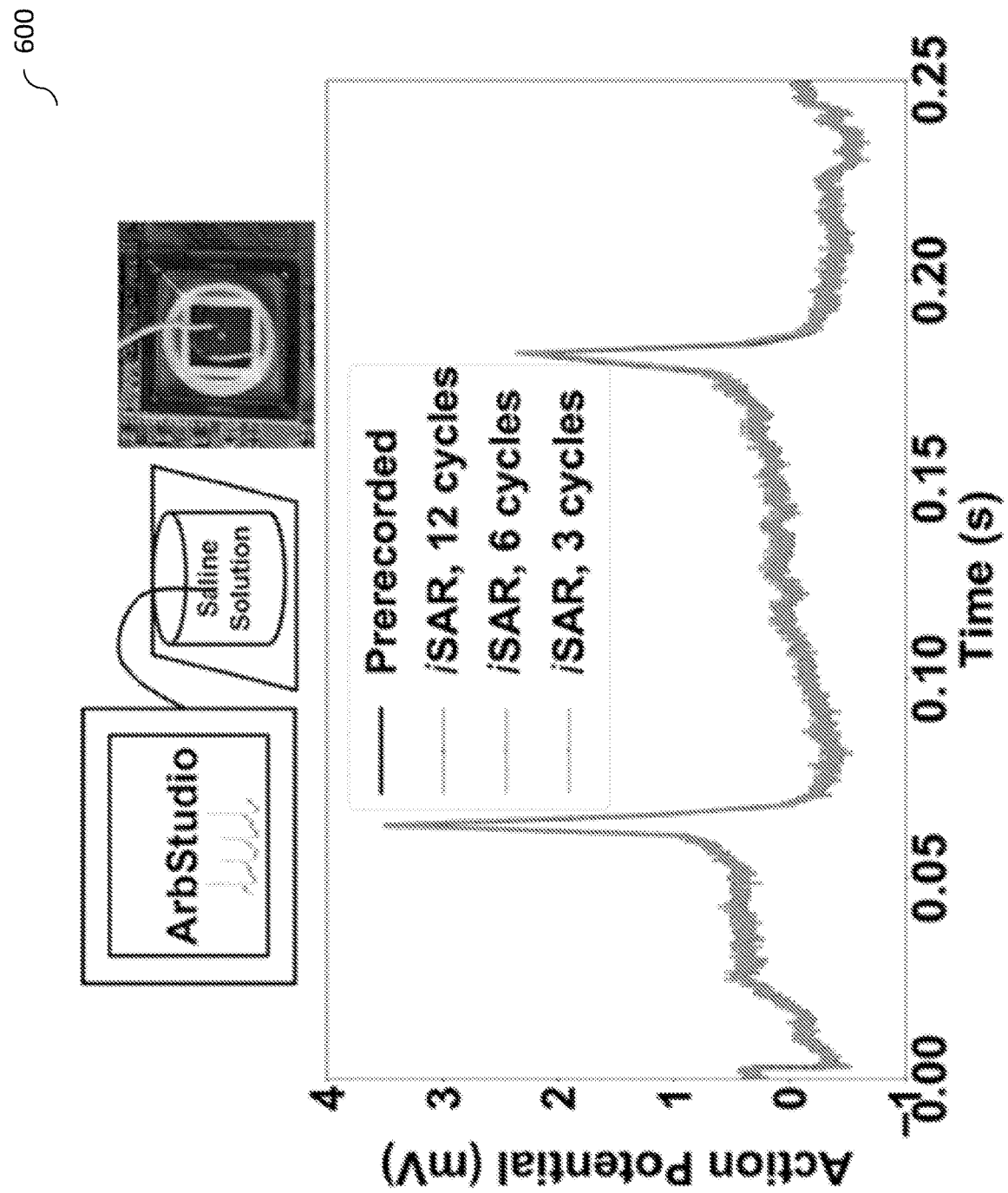
FIG. 6 illustrates an exemplary plot showing recording of regenerated spike neural data presented through saline in contact with the electrodes, for different number of iSAR cycles per conversion, according to some implementations of the current subject matter.

FIG. 6 illustrates an exemplary plot 600 illustrating experimental validation of the operational capabilities of the NISoC. For this validation, pre-recorded spike data from a leech ganglion neuron was played back on a voltage generator and the signal was applied to an electrode immersed in a saline solution in contact with the on-chip electrodes. As shown in FIG. 6, recording of pre-recorded spike data from a leech ganglion neuron, reconstituted to original amplitude and presented through an external electrode immersed in saline within an epoxy seal ring over the exposed depassivated top-metal electrode array, yields accurate reconstruction through the analog front-end (with gain 60) and ADC back-end even down to 3 iSAR cycles per conversion (as shown in FIG. 6).

In some exemplary, non-limiting implementations, as stated above, the current subject matter may be configured as a neural interface system-on-chip (NISoC) with 1,024 channels of simultaneous electrical recording and stimulation for high-resolution, high-throughput electrophysiology. The exemplary experimental implementation may include a 2 mm×2 mm NISoC in 65 nm CMOS that integrates a 32×32 array of electrodes. The electrodes may be vertically coupled to analog front-ends supporting both voltage and current clamping through a programmable interface, which may range over 100 dB in voltage and 120 dB in current, with 0.82 µW power per channel at 5.96 µ1/rms input-referred voltage noise from DC to 12.5 kHz signal bandwidth. This may include on-chip acquisition with a back-end array of 32 dynamic incremental SAR ADCs for 25 Msps 11-ENOB acquisition at 2 fJ/level FOM.

Current and voltage clamp functions may be activated by one or more analog switches controlled by local state variables based on local ternary coefficient and global signal waveform. Non-inverting voltage and integrating current amplification may share a single folded double-cascode OTA (94 dB open-loop DC gain at 500 nA bias) with configurable capacitive feedback for gain and bandwidth control through global control variables. Analog switches directly in contact to the integrating node may be centrally bulk-source connected for ultra-low leakage extending integration time for fA-range current acquisition. Unity gain, low-input capacitance buffering of the voltage output may be dynamically biased synchronous with time-multiplexed readout for substantial power savings with negligible kickback noise. Measured voltage gain, bandwidth, and input-referred noise (gain (G)=60) as a function of frequency are illustrated in FIG. 4.

Figure 7:
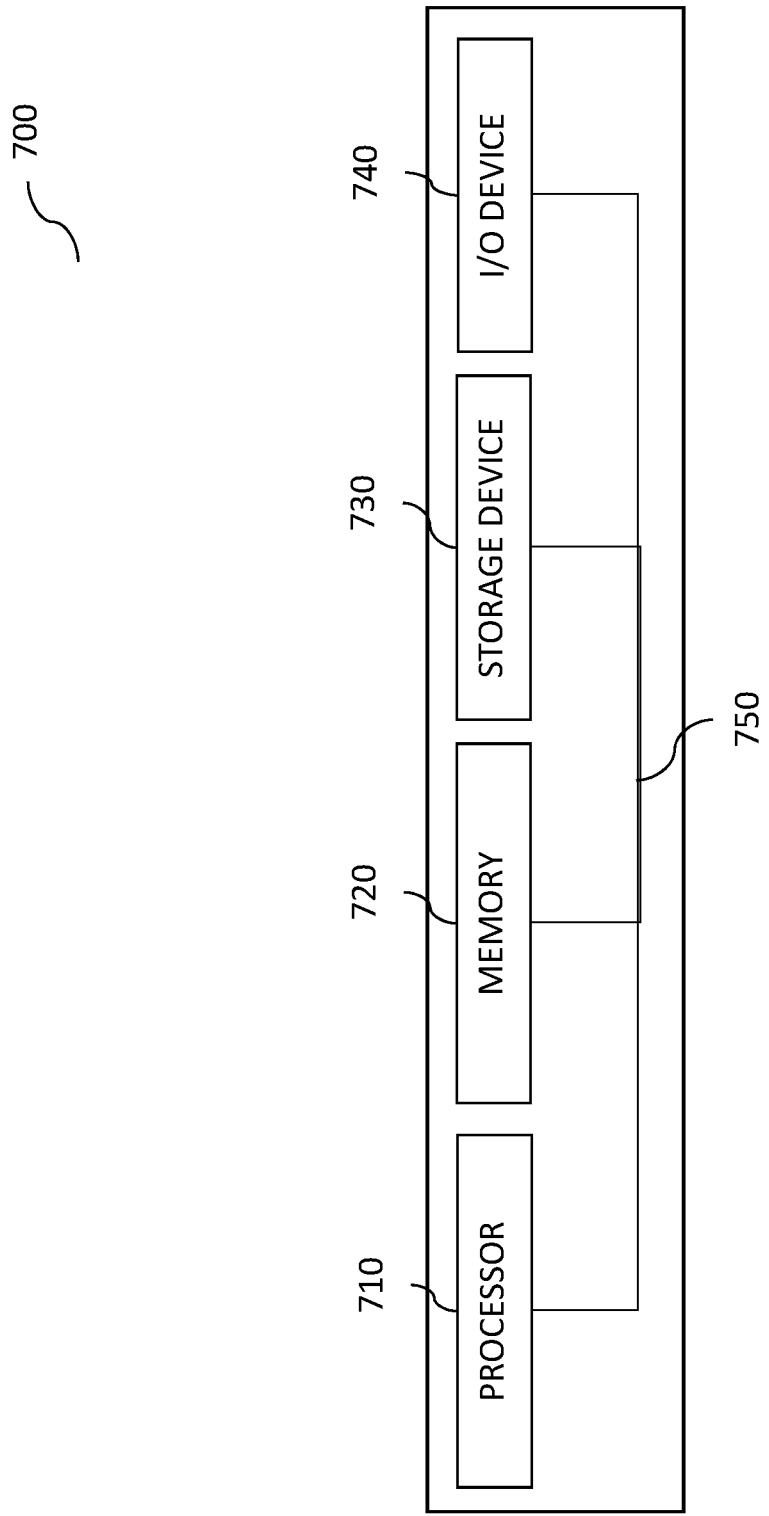
FIG. 7 illustrates an exemplary system, according to some implementations of the current subject matter.

In some implementations, the current subject matter can be configured to be implemented in a system 700, as shown in FIG. 7. The system 700 can include a processor 710, a memory 720, a storage device 730, and an input/output device 740. Each of the components 710, 720, 730 and 740 can be interconnected using a system bus 750. The processor 710 can be configured to process instructions for execution within the system 700. In some implementations, the processor 710 can be a single-threaded processor. In alternate implementations, the processor 710 can be a multi-threaded processor. The processor 710 can be further configured to process instructions stored in the memory 720 or on the storage device 730, including receiving or sending information through the input/output device 740. The memory 720 can store information within the system 700. In some implementations, the memory 720 can be a computer-readable medium. In alternate implementations, the memory 720 can be a volatile memory unit. In yet some implementations, the memory 720 can be a non-volatile memory unit. The storage device 730 can be capable of providing mass storage for the system 700. In some implementations, the storage device 730 can be a computer-readable medium. In alternate implementations, the storage device 730 can be a floppy disk device, a hard disk device, an optical disk device, a tape device, non-volatile solid state memory, or any other type of storage device. The input/output device 740 can be configured to provide input/output operations for the system 700. In some implementations, the input/output device 740 can include a keyboard and/or pointing device. In alternate implementations, the input/output device 740 can include a display unit for displaying graphical user interfaces.

In some implementations, the current subject matter relates to a system for recording neural signals (e.g., of a user's brain, etc.). The system (e.g., the system 100 as shown in FIG. 1) may include one or more electrodes (e.g., electrodes 103, as shown in FIG. 1) coupled to one or more corresponding analog front end components (e.g., AFEs 102, as shown in FIG. 1). The system may also include one or more analog to digital converter components (e.g., ADCs 104) coupled to the one or more electrodes. The electrodes, the analog front end components and the analog to digital converter components may be configured to form a neural interface system-on-chip for recording one or more neural signals.

In some implementations, the current subject matter may include one or more of the following optional features. The electrodes may be integrated on a complimentary metal-oxide-semiconductor integrated circuit. The analog front end components may be configured to be programmable for recording the one or more neural signals. In some exemplary, non-limiting implementations, the electrodes may be vertically coupled to the corresponding analog front end components.

In some implementations, the analog front end components may be configured to operate in at least one of the following programmable modes: a voltage clamp mode (e.g., as shown in FIG. 2c) and a current clamp mode (e.g., as shown in FIG. 2b). In the voltage clamp mode, the analog front end components may be configured to record one or more currents passing from the corresponding electrodes. By way of a non-limiting example, the currents may be associated with one or more ion currents configured to pass through one or more neural cells. In the current clamp mode, the analog front end components may be configured to record one or more voltage signals on the corresponding one or more electrodes. By way of a non-limiting example, the voltage signals may be generated by one or more neural cells after application of current to the neural cells.

In some implementations, the analog to digital converter components may be configured to perform digital conversion of one or more analog signals received from the analog front end components. Each analog to digital converter component may be configured to support a plurality of analog front end components.

In some implementations, the analog to digital converter components may include a sampling component (e.g., sampling circuit 302 as shown in FIG. 3a), a counter component and index component (e.g., circuit 308 as shown in FIG. 3a). The analog to digital converter components may be configured to operate using at least one of the following modes: a successive approximation register mode (e.g., as shown in FIGS. 3b-c) and an incremental successive approximation register mode (e.g., as shown in FIGS. 3d-e). In the successive approximation register mode, the index component of the analog to digital converter components may be configured to determine a least significant bit index value. The least significant bit index value may be determined based on a sampling of one or more input signals to the analog to digital converter components by the sampling component. The sampling may be performed using a plurality of sampling cycles. During each cycle in the plurality of cycles, the counter component may be configured to change a counter value based on an index value determined during a preceding sampling cycle in the plurality of cycles until the least significant index value is determined.

In some implementations, during the incremental successive approximation register mode, the index component may be configured to dynamically vary an index value based on a proximity of consecutive samplings of one or more input signals to the analog to digital converter components by the sampling component. The index component may be configured to decrease the index value until the least significant bit index value is determined. The index component may be configured to increase the index value when a digital to analog converter reference voltage value of the analog to digital converter components corresponds to the voltage value of one or more samplings of one or more input signals to the analog to digital converter components by the sampling component.

In some implementations, in at least one of the voltage clamp mode and the current clamp mode, the neural interface system-on-chip may be configured to determine an impedance of one or more signal channels corresponding to one or more electrodes. Further, the neural interface system-on-chip may be configured to select a signal channel with a lowest measured impedance.

In some exemplary implementations, the neural interface system-on-chip may be configured to measure one or more signals during at least one of the following: an electroencephalography (EEG), an ear-electroencephalography (ear-EEG), an electrocardiography (ECG), an electrooculography (EOG), and any combination thereof.

Moreover, in some exemplary implementations, the neural interface system-on-chip may be configured for at least one of the following: a seizure detection, a seizure forecasting, a detection of an inter-ictal discharge (IED) biomarker, an analysis of internal carotid artery (ICA), and any combination thereof.

Figure 8:
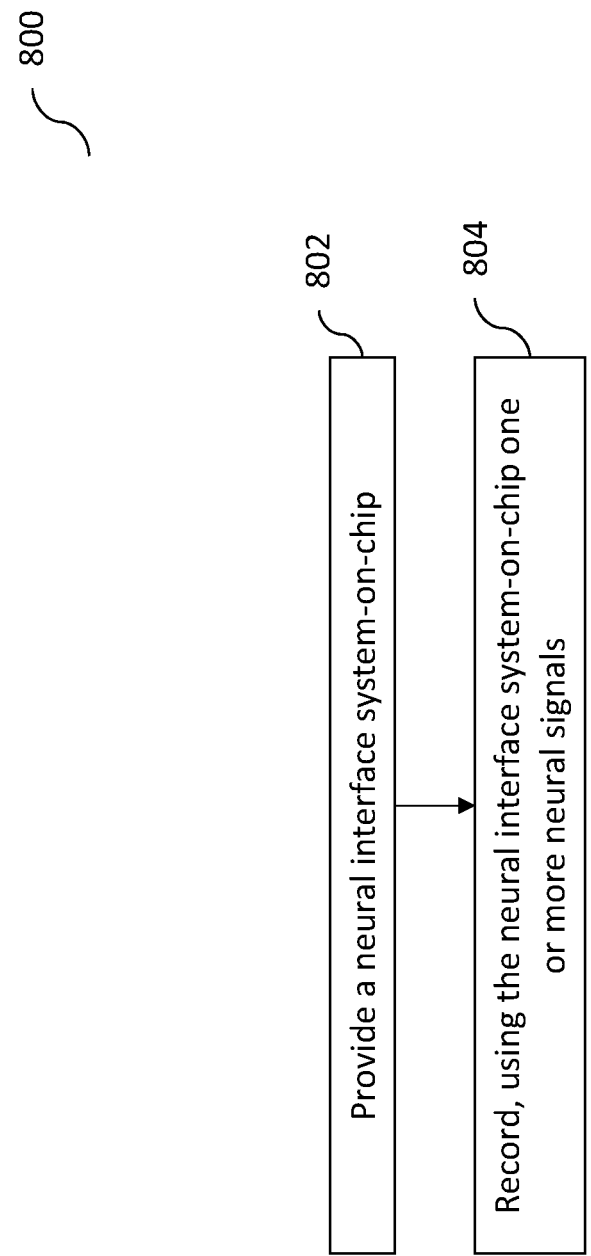
FIG. 8 illustrates an exemplary method, according to some implementations of the current subject matter.

FIG. 8 illustrates an exemplary method 800 for recording neural signals, according to some implementations of the current subject matter. At 802, a neural interface system-on-chip may be provided. The system may include, as discussed above, one or more electrodes integrated on a complimentary metal-oxide-semiconductor integrated circuit and coupled to one or more corresponding analog front end components. The analog front end components may be configured to be programmable for recording one or more neural signals and to operate in at least one of the following selectable programmable modes: a voltage clamp mode and a current clamp mode. The system may further include one or more analog to digital converter components coupled to the electrodes. At 804, using the neural interface system-on-chip, one or more neural signals may be recorded.

As stated above, the neural interface system-on-chip may, for example, be configured for measurement of one or more signals during at least one of the following: an electroencephalography (EEG), an ear-electroencephalography (ear-EEG), an electrocardiography (ECG), an electrooculography (EOG), and any combination thereof. Additionally, the neural interface system-on-chip may also be configured, for example, for at least one of the following: a seizure detection, a seizure forecasting, a detection of an inter-ictal discharge (TED) biomarker, an analysis of internal carotid artery (ICA), and any combination thereof.

In some implementations, the recording may include programming the analog front end components for recording the one or more neural signals.

One or more aspects or features of the subject matter described herein can be realized in digital electronic circuitry, integrated circuitry, specially designed ASICs, field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example, as would a processor cache or other random access memory associated with one or more physical processor cores.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. For example, the logic flows may include different and/or additional operations than shown without departing from the scope of the present disclosure. One or more operations of the logic flows may be repeated and/or omitted without departing from the scope of the present disclosure. Other implementations may be within the scope of the following claims.

What is claimed:

1. A system, comprising:
one or more electrodes integrated on a complimentary metal-oxide-semiconductor integrated circuit and coupled to one or more corresponding analog front end components, the one or more analog front end components are configured to be programmable for recording one or more neural signals and to operate in at least one of the following selectable programmable modes: a voltage clamp mode and a current clamp mode; and
one or more analog to digital converter components coupled to the one or more electrodes, wherein at least one of the one or more analog to digital converter components comprises a sampling component, a counter component, and an index component, and wherein the one or more analog to digital converter components is configured to operate in an incremental successive approximation register mode in which, for each sampling of an input signal, the counter component is configured to change a counter value to a value corresponding to a preceding sampling of the input signal and the index component is configured to dynamically vary an index value based on a proximity of consecutive samplings until a least significant bit index value is determined;

the one or more electrodes, the one or more analog front end components, and the one or more analog to digital converter components forming a neural interface system-on-chip for recording of the one or more neural signals.

2. The system according to claim 1, wherein upon a selection of the voltage clamp mode, the one or more analog front end components is configured to record one or more currents passing from the corresponding one or more electrodes.

3. The system according to claim 1, wherein upon a selection of the current clamp mode, the one or more analog front end components is configured to record voltage on the corresponding one or more electrodes.

4. The system according to claim 1, wherein the one or more analog to digital converter components are configured to perform digital conversion of one or more analog signals received from the one or more analog front end components.

5. The system according to claim 1, wherein each analog to digital converter component in the one or more analog to digital components is configured to support a plurality of analog front end components.

6. The system according to claim 1, wherein the one or more analog to digital converter component is configured to further operate using at least a successive approximation register mode.

7. The system according to claim 6, wherein in the successive approximation register mode, the index component of the one or more analog to digital converter components is configured to determine a least significant bit index value.

8. The system according to claim 7, wherein the least significant bit index value is determined based on a sampling of one or more input signals to the one or more analog to digital converter components by the sampling component.

9. The system according to claim 1, wherein the index component is configured to decrease the index value until the least significant bit index value is determined.

10. The system according to claim 9, wherein the index component is configured to increase the index value when a digital to analog converter reference voltage value of the one or more analog to digital converter components corresponds to the voltage value of one or more samplings of one or more input signals to the one or more analog to digital converter components by the sampling component.

11. The system according to claim 1, wherein, in at least one of the voltage clamp mode and the current clamp mode, the neural interface system-on-chip is configured to determine an impedance of one or more signal channels corresponding to the one or more electrodes.

12. The system according to claim 11, wherein the neural interface system-on-chip is configured to select a signal channel in the one or more signal channels having a lowest determined impedance.

13. The system according to claim 1, wherein the neural interface system-on-chip is configured to measure one or more signals during at least one of the following: an electroencephalography (EEG), an ear-electroencephalography (ear-EEG), an electrocardiography (ECG), an electrooculography (EOG), and any combination thereof.

14. The system according to claim 1, wherein the neural interface system-on-chip is configured for at least one of the following: a seizure detection, a seizure forecasting, a detection of an inter-ictal discharge (IED) biomarker, an analysis of internal carotid artery (ICA), and any combination thereof.

15. A method, comprising:
providing a neural interface system-on-chip including
one or more electrodes integrated on a complimentary metal-oxide-semiconductor integrated circuit and coupled to one or more corresponding analog front end components, the one or more analog front end components are configured to be programmable for recording one or more neural signals and to operate in at least one of the following selectable programmable modes: a voltage clamp mode and a current clamp mode; and
one or more analog to digital converter components coupled to the one or more electrodes, wherein at least one of the one or more analog to digital converter components including a sampling component, a counter component, and an index component, and wherein the one or more analog to digital converter components is configured to operate in an incremental successive approximation register mode in which, for each sampling of an input signal, the counter component is configured to change a counter value to a value corresponding to a preceding sampling of the input signal and the index component is configured to dynamically vary an index value based on a proximity of consecutive samplings until a least significant bit index value is determined;
the one or more electrodes, the one or more analog front end components, and the one or more analog to digital converter components forming a neural interface system-on-chip for recording of the one or more neural signals; and
recording, using the neural interface system-on-chip, one or more neural signals.

16. The method according to claim 15, wherein the neural interface system-on-chip is configured for measurement of one or more signals during at least one of the following: an electroencephalography (EEG), an ear-electroencephalography (ear-EEG), an electrocardiography (ECG), an electrooculography (EOG), and any combination thereof.

17. The method according to claim 15, wherein the neural interface system-on-chip is configured for at least one of the following: a seizure detection, a seizure forecasting, a detection of an inter-ictal discharge (IED) biomarker, an analysis of internal carotid artery (ICA), and any combination thereof.

* * * * *